(12) United States Patent
Takahashi (10) Patent No.: US 8,776,336 B2
(45) Date of Patent: Jul. 15, 2014

(54) METHOD FOR MANUFACTURING PIEZOELETRIC RESONATOR

(75) Inventor: Takehiro Takahashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 608 days.

(21) Appl. No.: 13/066,396

(22) Filed: Apr. 14, 2011

(65) Prior Publication Data

US 2011/0191995 A1 Aug. 11, 2011

Related U.S. Application Data

(62) Division of application No. 11/879,455, filed on Jul. 17, 2007, now Pat. No. 7,950,120.

(30) Foreign Application Priority Data

Jul. 20, 2006 (JP) ................................ 2006-197649

(51) Int. Cl.
*H03H 3/04* (2006.01)
*H03H 9/215* (2006.01)

(52) U.S. Cl.
USPC ........... 29/25.35; 29/594; 29/847; 29/896.22; 216/39; 216/41; 216/52; 310/313 R (58) Field of Classification Search
USPC .................. 29/25.35, 594, 846, 847, 896.22; 216/39, 41, 47, 52; 310/312, 312 R, 310/370, 313 R See application file for complete search history.

(56) References Cited

U.S. PATENT DOCUMENTS 6,939,475 B2 * 9/2005 Satoh et al. .................... 216/47

FOREIGN PATENT DOCUMENTS

| JP | 04199906 A | * | 7/1992 |
| JP | 2002-76806 | | 3/2002 |

* cited by examiner

*Primary Examiner* — A. Dexter Tugbang
(74) *Attorney, Agent, or Firm* — Jordan and Hamburg LLP (57) ABSTRACT

A first metal film is formed on a piezoelectric substrate surface. A pattern of openings forming a first resist mask is formed in the first metal film. Portions of the metal film are removed by etching. The substrate is brought into contact with a first etching solution to remove substrate material to shape an outer surface. After, openings in the first metal film are filled in with a second metal film. The substrate is shaped into a first plurality of piezoelectric resonators using a second etching solution. Rough frequency adjustment is conducted by etching side surfaces of the substrate in increments and cutting a piezoelectric resonator from the substrate. The rough frequency adjustment continues until a measured oscillation frequency is within a predetermined frequency range. Electrode patterns then are formed for each one of the second plurality of piezoelectric resonators.

1 Claim, 9 Drawing Sheets

METHOD FOR MANUFACTURING PIEZOELETRIC RESONATOR

This is a Divisional Application of U.S. Ser. No. 11/879,455 filed Jul. 17, 2007.

BACKGROUND OF THE INVENTION

1. Field of the Invention

The present invention relates to a technology for manufacturing, for instance, a tuning fork type piezoelectric resonator using a piezoelectric substrate made of, for instance, quartz crystal or the like.

2. Description of the Related Art

The tuning fork type quartz resonator has long been adopted as a signal source for pacing of a wrist watch owing to its compactness, inexpensiveness and low power consumption, and the uses thereof are still expanding. The CI (crystal impedance) value of this quartz resonator is required to be as small as possible for the purpose of reducing the power loss, and therefore a quartz resonator of which oscillation efficiency is enhanced by forming a groove therein has been used for this purpose.

Figure 7:
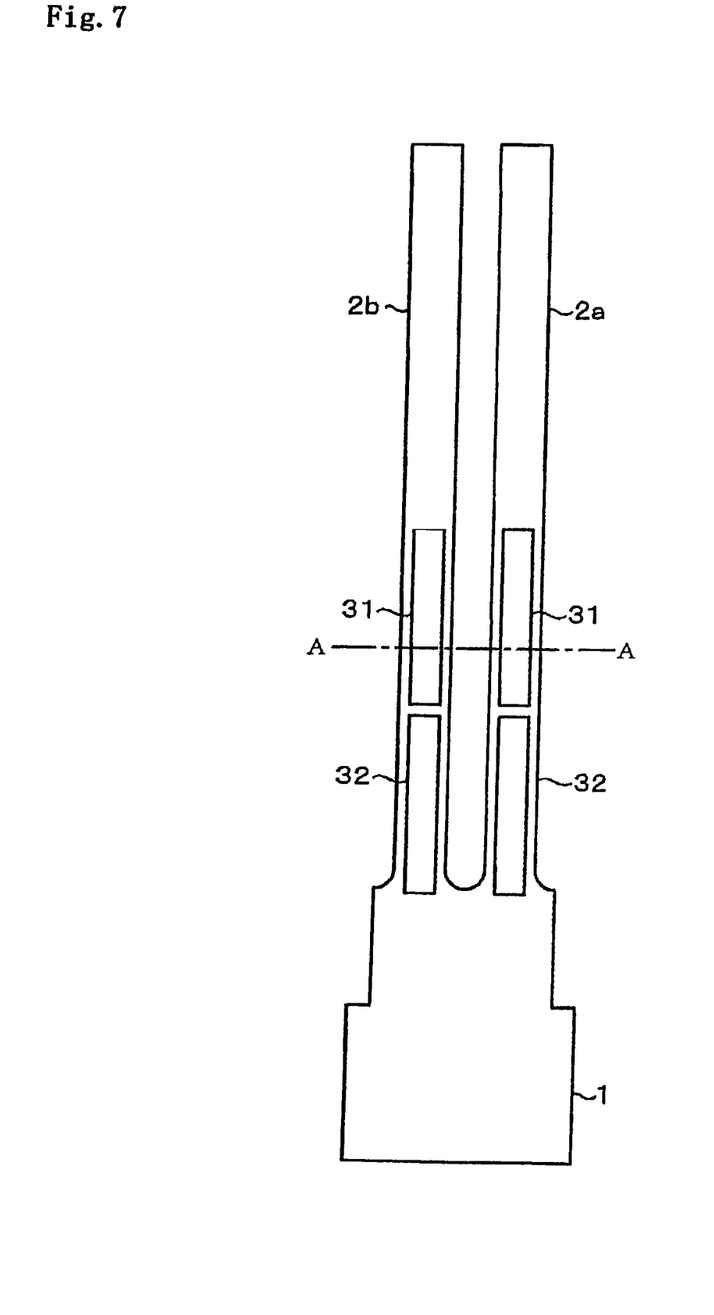
FIG. 7 is a schematic plan view showing an example of the tuning is fork type quartz resonators.

As shown in FIG. 7, the quartz resonator is provided with a pair of vibrating arms 2a and 2b in a base 1, and the grooves 31 and 32 are respectively arranged on both main surfaces of the respective vibrating arms 2a and 2b. Excitation electrodes for exciting tuning fork vibration based on bending vibration are formed in these grooves 31, 32 and the respective vibrating arms 2a, 2b.

Figure 8A:
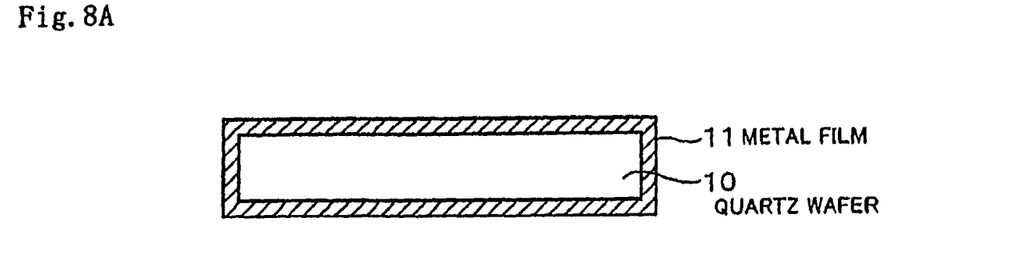
FIGS. 8A to 8E are schematic cross sectional views showing the method for manufacturing a conventional tuning fork type quartz resonator.
Figure 8B:
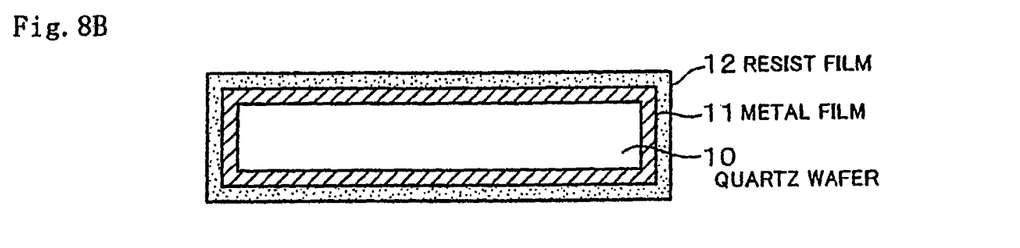

The above-described quartz resonator is manufactured according to the following process (refer to Patent Document 1). FIGS. 8A to 8E and FIGS. 9F to 9I are views showing the manufacturing processes of the cross sectional portion along A-A line in FIG. 7. First, after polishing and cleaning a cutout quartz wafer 10, a metal film 11 is formed by a sputtering method (FIG. 8A). A film in which gold (Au) is stacked on a backing film of, for instance, chromium (Cr) is used as the metal film 11.

Figure 8C:
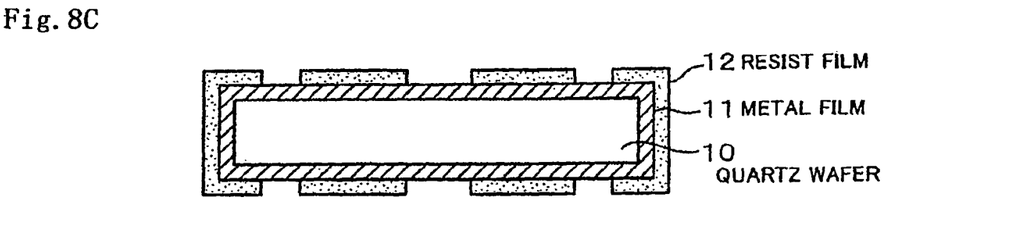
Figure 8D:
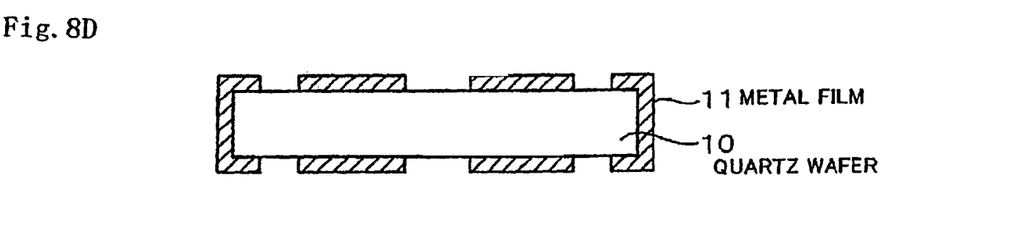

Then, after applying photoresist on such a metal film 11 by a spray method for instance (FIG. 8B), the photoresist is exposed and developed in a manner to obtain a pattern having the shape of the quartz piece 10, namely, a tuning fork shape pattern, so that a tuning fork shaped resist film 12 is formed (FIG. 8C). Thereafter, the portion of the metal film 11 not covered with the resist film 12 is removed by etching, and the whole resist film 12 remaining on the quartz wafer 10 is removed (FIG. 8D).

Figure 8E:
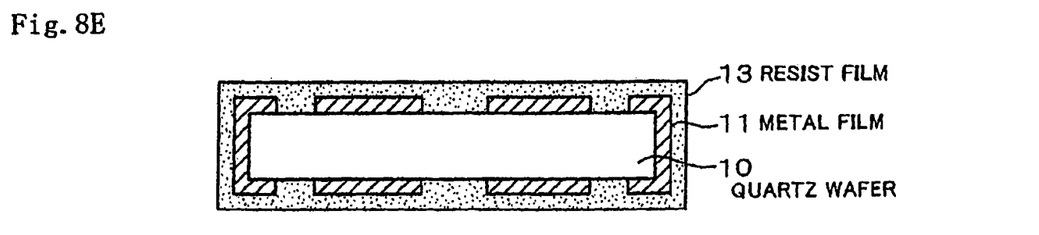
Figure 9F:
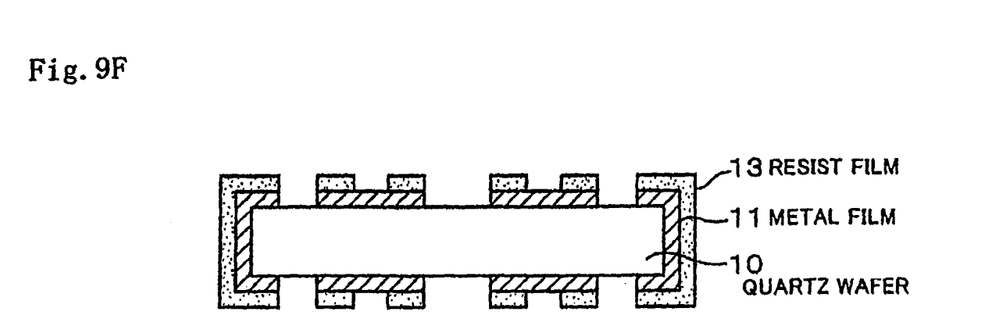
FIGS. 9F to 9I are schematic cross sectional views showing the method for manufacturing the conventional tuning fork type quartz resonator.
Figure 9G:
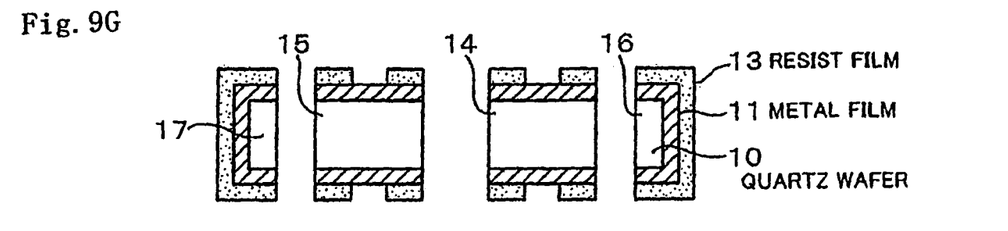

Next, photoresist is applied to the whole surface of the quartz wafer 10 by, for instance, a spray method, and the photoresist is exposed and developed to form a resist film 13 (FIG. 8E). Then, the resist film 13 is peeled off so that the outside shape of the quartz piece is left, and the resist film 13 at portions corresponding to the grooves 31 and 32 shown in FIG. 7 is peeled off (FIG. 9F).

Figure 9H:
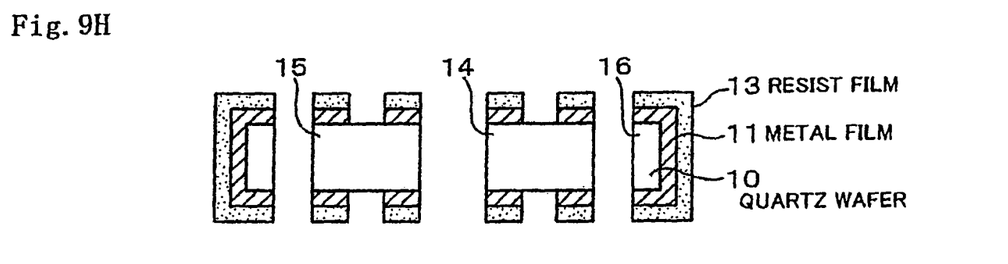
Figure 9I:
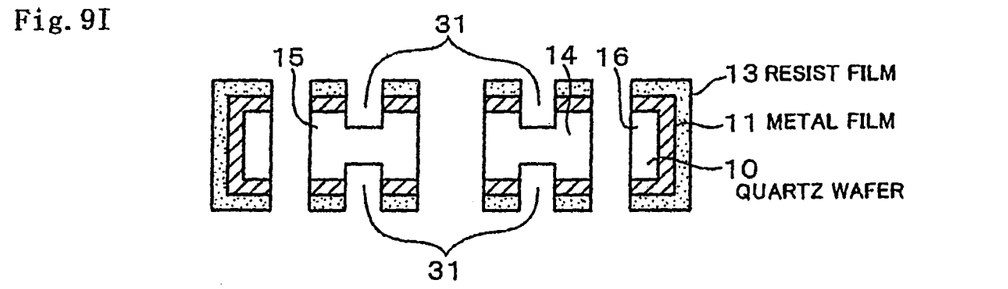

Thereafter, wet etching is conducted by immersing the quartz wafer 10 in hydrofluoric acid which is an etching solution using the resist film 13 as a mask to form the outside shape of the quartz piece (FIG. 9G). 14 and 15 in FIGS. 9F to 9I are portions corresponding to the vibrating arms 2a and 2b, and 16 and 17 in FIGS. 9F to 9I are outer frame portions described for convenience of taking out a sheet of quartz piece from the quartz wafer. Then, wet etching is conducted by immersing the quartz wafer 10 in a potassium iodide (KI) solution using the resist film 13 as a mask to remove the metal film 11 at the portions corresponding to the grooves 31 and 32 shown in FIG. 7 (FIG. 9H). Then, wet etching is performed by immersing the quartz wafer 10 in hydrofluoric acid. By these processes, the grooves 31 and 32 are formed on both main surfaces of the quartz piece 10 (FIG. 9I).

Thereafter, a frequency matching process (rough adjustment in oscillation frequency) through which matching to a prescribed frequency is performed by reprocessing the side surfaces of the outside shape of the quartz piece 10 and the grooves 31, 32 by immersing the quartz wafer 10 in hydrofluoric acid. The frequency matching process includes immersing the quartz wafer 10 in hydrofluoric acid, suspending the wet etching after a predetermined period of time, cutting out a quartz piece from the original which is in a state of before forming an electrode pattern and forming the electrode on the quartz piece. A prescribed voltage is applied to the electrode and the oscillation frequency f is detected to determine whether or not the oscillation frequency f is within the predetermined frequency.

Thereafter, an electrode pattern is formed on the surface of the quartz piece 10, a fine adjustment in the oscillation frequency is conducted by shaving the metal film formed on the tip portion of the vibrating arm so as to adjust the thickness thereof.

The oscillation frequency of quartz resonator is determined depending upon the length and the width of the vibrating arms 2a and 2b, the length, width and depth of the grooves 31, 32 and the like shown in FIG. 7. Accordingly, in the frequency matching process before forming the above-described electrode pattern, since the side surfaces of the outside shape and the grooves 31, 32 of the quartz piece 10 are etched simultaneously, the change in frequency is very large, and it is difficult to suspend the etching process at the most suitable point where the predetermined frequency is obtained. Therefore, it has a problem that fine frequency adjustment doesn't go well even through the frequency adjustment process after the electrode pattern forming process, which reduces yields.

[Patent Document 1]
Japanese Patent Application Laid-open No. 2002-76806 (columns 0094 to 0113, FIG. 9 to FIG. 13)

SUMMARY OF THE INVENTION

The present invention is achieved under the consideration of such a circumstance and its object is to provide a method for manufacturing a piezoelectric resonator which can perform frequency matching with high reliability when conducting rough frequency adjustment by adjusting the shape formation of a piezoelectric oscillating piece before forming an electrode film so that the reduction in the yields can be prevented.

In the method for manufacturing a piezoelectric resonator including a base, a plurality of vibrating arms extending from the base, grooves formed to in these respective vibrating arms, the present invention includes the steps of:

forming a metal film on the surface of the base which is a piezoelectric substrate;

patterning the surface of the metal film so that the outside shape portion of the piezoelectric oscillating piece is left, forming a resist mask having apertures at the portions corresponding to the grooves of the vibrating arms, and removing the metal film by etching;

forming the grooves on the vibrating arms thereafter by bringing the above-described substrate into contact with an etching solution, and forming the shape of the piezoelectric oscillating piece to the same depth as the grooves;

thereafter, peeling off all of the metal film remaining on the substrate surface;

then forming a metal film on the substrate surface;

forming a resist mask which is patterned in a manner that the outside shape portion of the piezoelectric oscillating piece is left, on the substrate surface, for the purpose of performing only etching of the outside shape, and removing the metal film by etching;

continuing the shape formation of the piezoelectric oscillating piece by bringing the above-described substrate into contact with an etching solution to form the shape of the piezoelectric oscillating piece;

then, etching the side surface of the piezoelectric oscillating piece, forming an electrode on a piezoelectric oscillating piece for frequency evaluation, which is cut out from the substrate, measuring the oscillation frequency, and conducting rough frequency adjustment by adjusting the etching amount of the side surface of the outside shape based on the measurement result; and then, forming the electrode patterns on the surfaces of all piezoelectric oscillating pieces.

Further, in the method for manufacturing the piezoelectric resonator including a base, a plurality of vibrating arms extending from the base, grooves formed in these respective vibrating arms, the present invention includes the steps of:

forming a metal film on the surface of the base which is a piezoelectric substrate;

patterning the surface of the metal film so that the outside shape portion of the piezoelectric oscillating piece is left, forming a resist mask having apertures at the portions corresponding to the grooves of the vibrating arms, and removing the metal film by etching;

forming the grooves on the vibrating arms thereafter by bringing the above-described substrate into contact with an etching solution, and forming the shape of the piezoelectric oscillating piece to the same depth as the grooves;

thereafter, covering the aperture areas of the metal film opening at the portions corresponding to the grooves of the vibrating arm with the metal film;

next, continuing the shape formation of the piezoelectric oscillating piece by bringing the above-described substrate into contact with an etching solution to form the shape of the piezoelectric oscillating piece;

then, etching the side surface of the piezoelectric oscillating piece, forming an electrode on the piezoelectric oscillating piece for frequency evaluation, which is cut out from the substrate, measuring the oscillation frequency, and conducting rough frequency adjustment by adjusting the etching amount of the side surface of the outside shape based on the measurement result; and then, forming the electrode patterns on the surfaces of all piezoelectric oscillating pieces.

According to the present invention, etching to form the outside shape of the piezoelectric oscillating piece and etching to form the grooves are conducted simultaneously, and after forming the groove, the shape formation of the piezoelectric oscillating piece is started again from the same depth as the grooves under the condition of covering the grooves with the metal film. After the outside shape is formed, matching of frequency is conducted by etching the side surface of the piezoelectric oscillating piece in succession. Therefore, the matching of frequency can be performed by processing only the side surface of the piezoelectric oscillating piece. Accordingly, compared with the usual practice of conducting the frequency matching by processing the side surface of the piezoelectric oscillating piece and processing the grooves formed in the vibrating arms at the same time, the rough frequency adjustment can be achieved at a low etching rate. Therefore, it is possible to perform the frequency matching without undue difficulty and with high accuracy. This makes it possible to get the piezoelectric oscillating piece which has an easily adjustable range of frequency with high reliability when conducting the fine frequency adjustment after forming the electrode pattern later.

DETAILED DESCRIPTION OF THE PREFERRED EMBODIMENT(S)

A method for manufacturing a tuning fork type quartz resonator which is a piezoelectric resonator will be explained as an embodiment of the present invention. Since the structure of the quartz resonator relating to the present embodiment is the same as that of the quartz resonator explained in the article of Related Art with reference to FIG. 7, explanation of the same portions will be omitted.

Figure 1:
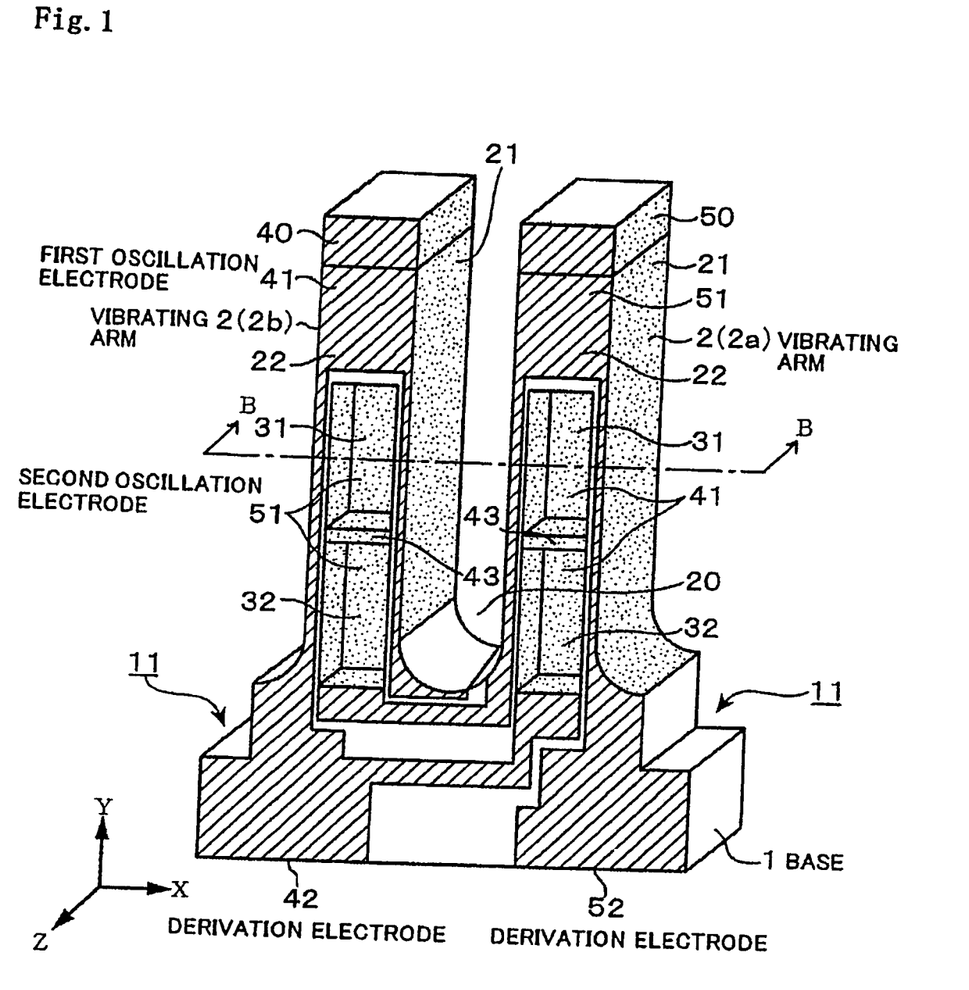
FIG. 1 is a perspective view showing an example of the tuning fork type quartz resonators relating to an embodiment of the present invention.

As shown in FIG. 1, a first excitation electrode 41 is formed on the whole inner surfaces of a plurality of grooves aligned in the longitudinal direction of an vibrating arm 2a, for instance, a first groove 31 and a second groove 32, and between these grooves 31 and 32 on the vibrating arm 2a out of the vibrating arms 2. That is, by the excitation electrode 41 formed on a so-called bridge portion 43 corresponding to a portion between the first groove 31 and the second groove 32, the excitation electrodes 41 within the respective grooves 31 and 32 of the vibrating arm 2a are connected to each other. The second excitation electrode 51 is formed on both side surfaces 21, 21 of the vibrating arm 2a and the tip portions of the main surfaces 22, 22 (the front side and the back side). Furthermore, on the tip portion of the vibrating arm 2a, an adjusting weight 50 which is a metal film for adjusting the oscillation frequency by adjusting the weight is installed. The adjusting weight 50 is a part of the excitation electrode 51, but the film thickness and materials for the electrode etc. are different from electrodes on other portions. It should be noted that the excitation electrodes 41 and 51 in FIG. 1 are expressed using slant lines and black dots to make the drawing of both electrodes easier to see. Accordingly, the slant lines in FIG. 1 are not for showing a cross section of the quartz piece.

A second excitation electrode 51 is formed on the whole inner surfaces of a plurality of grooves aligned in the longitudinal direction of a vibrating arm 2b, for instance, a first groove 31 and a second groove 32, and between each of these grooves 31 and 32 on the vibrating arm 2b out of the vibrating arms 2. The first excitation electrode 41 is formed on both side surfaces 21, 21 of the vibrating arm 2b and the tip portions of the main surfaces 22, 22 (the front side and the back side). It should be noted that even on the tip portion of the vibrating arm 2b, an adjusting weight 40 for adjusting the oscillation frequency by adjusting the weight is installed in the similar manner. The arrangement of electrodes provided on the vibrating arms 2a and 2b are the same as each other except that the excitation electrodes 41 and 51 are reversed. An electrode pattern made of a derivation electrode 42 is formed on the surface of a base 1 so that these first excitation electrodes 41 are electrically connected to each other. An electrode pattern made of a derivation electrode 52 is formed on the surface of the base 1 so that the second excitation electrodes 51 are electrically connected.

Figure 2A:
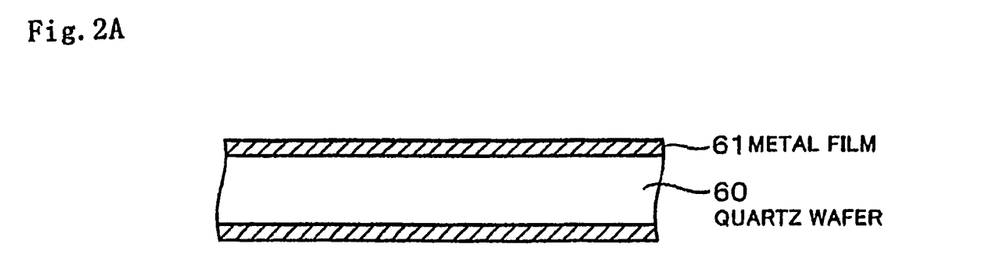
FIGS. 2A to 2E are schematic cross sectional views showing a method for manufacturing the tuning fork type quartz resonator relating to the embodiment of the present invention.
Figure 2B:
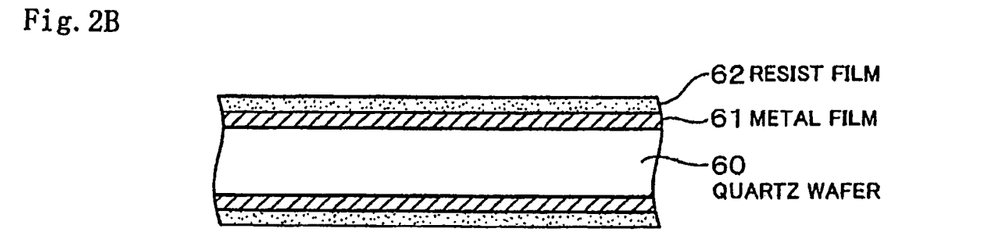

A method for manufacturing the quartz resonator shown in FIG. 1 will be explained referring to FIG. 2A to FIG. 4O. Though a large number of quartz resonators can be obtained from a sheet of piezoelectric substrate, FIG. 2A to FIG. 4O are views which explain one piece of the quartz resonator made at a certain portion of a sheet of the piezoelectric substrate. FIG. 2A to FIG. 4O are views showing manufacturing processes for a cross Sectional portion along B-B line in FIG. 1. First, after polishing and cleaning a quartz wafer 60 which is a cut out substrate, a metal film 61 is formed by a sputtering method (FIG. 2A). A film in which gold (Au) is stacked on a backing film of, for instance, chromium (Cr) is used as the metal film 61.

Figure 2C:
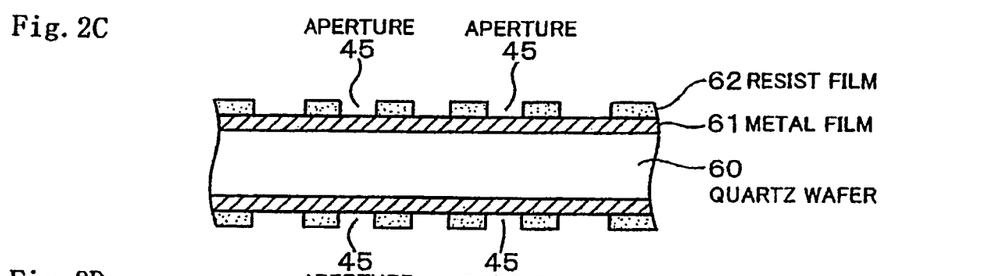
Figure 2D:
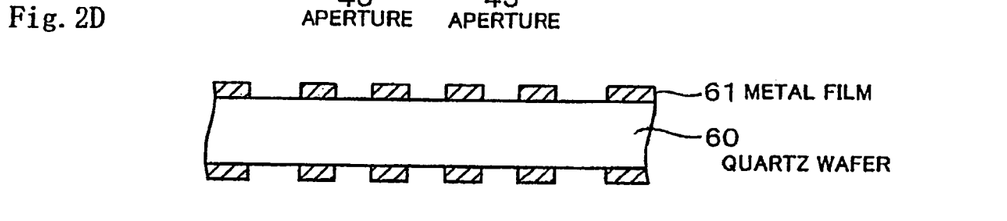

Then, after applying photoresist on such a metal film 61 by a spray method for instance (FIG. 2B), the photoresist is exposed and developed to form a tuning fork shaped resist film 62 having an aperture 45 at portions corresponding to the above-described grooves 31 and 32 (FIG. 2C). Thereafter, the quartz wafer 60 is immersed in a potassium iodide solution (KI) using the resist film 62 as a mask to perform wet etching. Thereby, a portion of the metal film 61 not covered by the resist film 62 is removed (FIG. 2D).

Figure 2E:
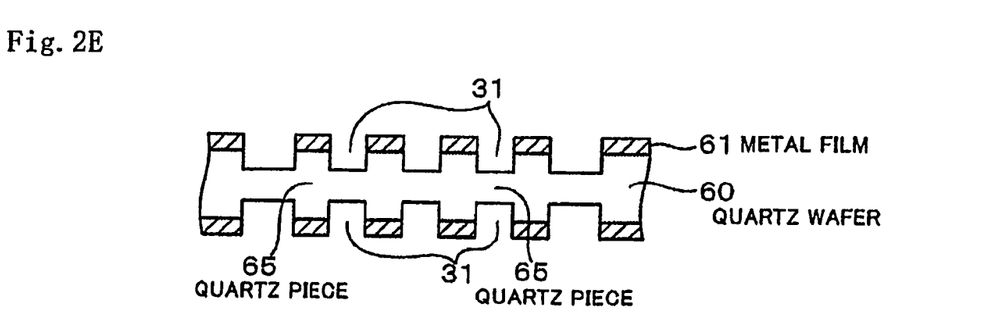
Figures 3F, 3G:
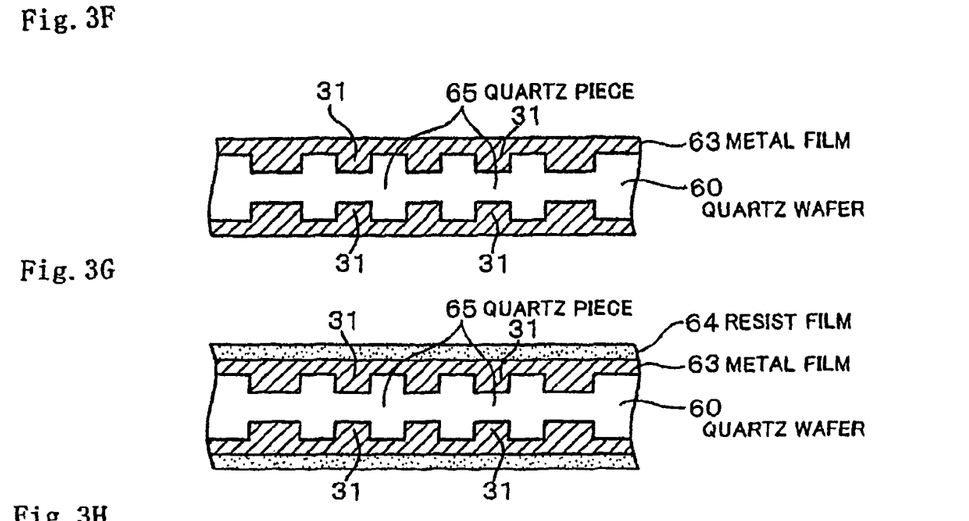
FIGS. 3F to 3J are schematic cross sectional views showing the method for manufacturing the tuning fork type quartz resonator relating to the embodiment of the present invention.

Then, the quartz wafer 60 is immersed in hydrofluoric acid that is an etching solution to perform wet etching so that the grooves 31 and 32 of the vibrating arms 2a and 2b shown in FIG. 1 are formed and the outside shape of a quartz piece 65 is formed to the same depth as the grooves 31 and 32 (FIG. 2E). Next, after all of the metal film 61 remaining on the surface of the quartz wafer 60 is peeled off, a new metal film 63 is formed on the surface of the quartz wafer 60 by the sputtering method in the same way (FIG. 3F).

Figures 3H, 3I:
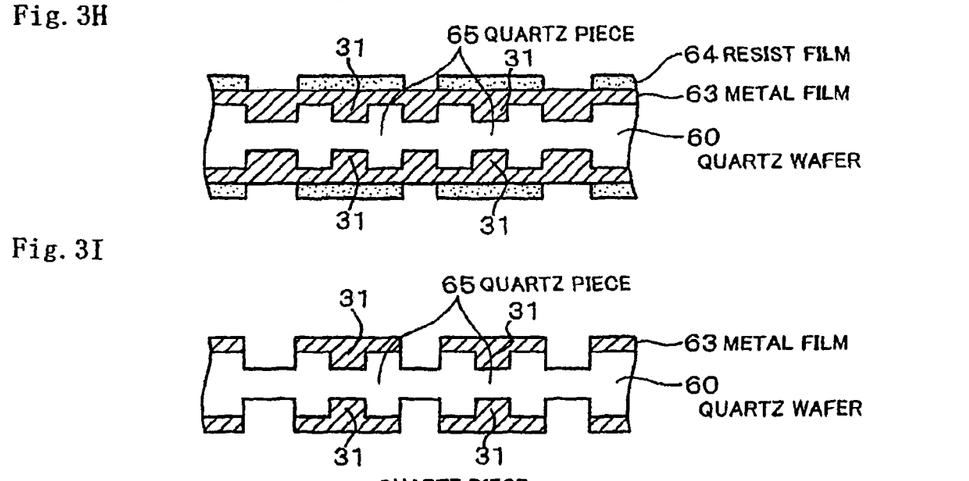

Next, after applying photoresist on the surface of the quartz wafer 60 by the spray method for instance (FIG. 3G), the photoresist is exposed and developed in a manner so as to obtain a pattern having the shape of the quartz piece, namely, a tuning fork shape pattern, so that a tuning fork shaped resist film 64 is formed (FIG. 3H). Wet etching is conducted by immersing the quartz wafer 60 into a potassium iodide solution and a portion of the metal film 63 not covered with the resist film 64 is removed (FIG. 3I).

Figure 3J:
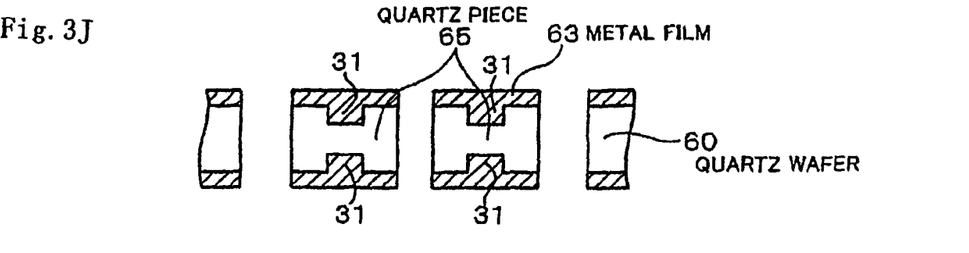

Thereafter, wet etching is conducted by immersing the quartz wafer 60 into hydrofluoric acid that is an etching solution so that the continuation of the outside shape formation of the quartz piece 65 is conducted from the same depth as the grooves 31 and 32. After forming the outside shape of the quartz piece 65, rough frequency adjustment is conducted by etching the side surface of the outside shape of the quartz piece 65 consecutively (FIG. 3J).

Figure 5:
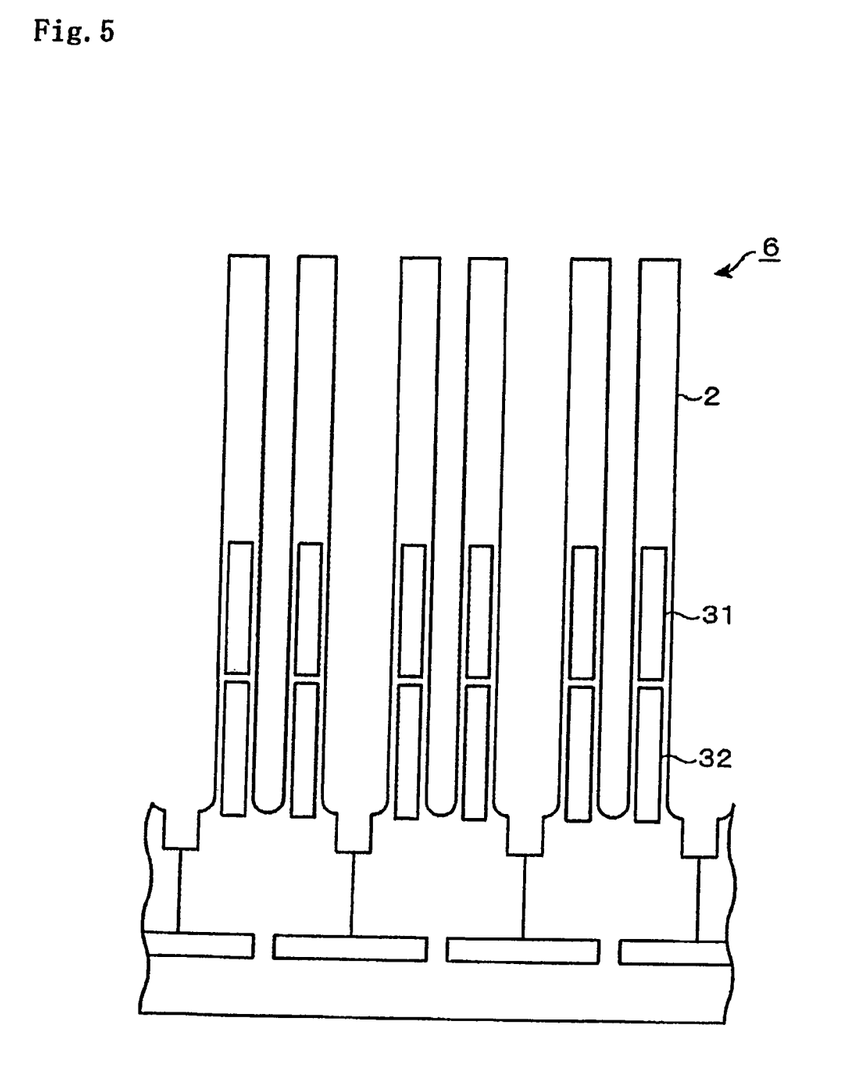
FIG. 5 is a plan view showing an example of the originals of the quartz oscillating piece manufactured in the manufacturing process of the tuning fork type quartz resonator relating to the embodiment of the present invention.

The rough frequency adjustment is conducted in the following manner. The quartz wafer 60 is immersed into hydrofluoric acid first, and the wet etching is suspended when a predetermined period of time has passed. One piece of the quartz piece 65 for evaluating frequency is cut out from an original 6 in which the electrode pattern shown in FIG. 5 has not formed yet and an electrode is formed on the quartz piece 65. Then, a prescribed voltage is applied to the electrode and an oscillation frequency f is detected to determine whether or not the oscillation frequency f is within a predetermined frequency. At this time, if the oscillation frequency f is not within the range of a predetermined range of frequency, the quartz wafer 60 is further immersed into hydrofluoric acid to conduct the wet etching. When a predetermined period of time has passed, the wet etching is suspended, and one piece of the quartz piece 65 for evaluating the frequency is cut out from the original 6 in which the electrode pattern has not formed yet similarly. An electrode is formed on this piece of the quartz piece 65, and a predetermined voltage is applied to the electrode and the oscillation frequency f is detected to determine whether or not the oscillation frequency f is within the predetermined range of the frequency. Thus, by minutely adjusting the time for the etching of the quartz wafer 60 with hydrofluoric acid, the frequency matching is performed. Thereafter, the metal film 63 remaining on the quartz wafer 60 is removed.

Figure 4K:
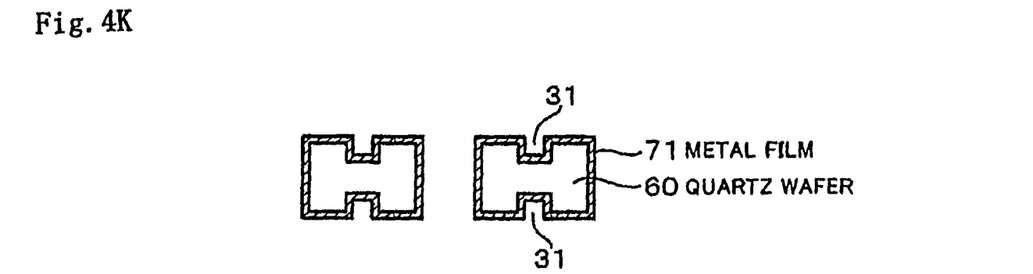
FIGS. 4K to 4O are schematic cross sectional views showing the method for manufacturing the tuning fork type quartz resonator relating to the embodiment of the present invention.

A process to prepare an electrode pattern will be explained next. Firstly, a metal film 71 to be an electrode is formed on both surfaces of the original 6 by the sputtering method (FIG. 4K). A film in which gold (Au) is stacked on a backing film of, for instance, chromium (Cr) is used as the metal film 71.

Figure 4L:
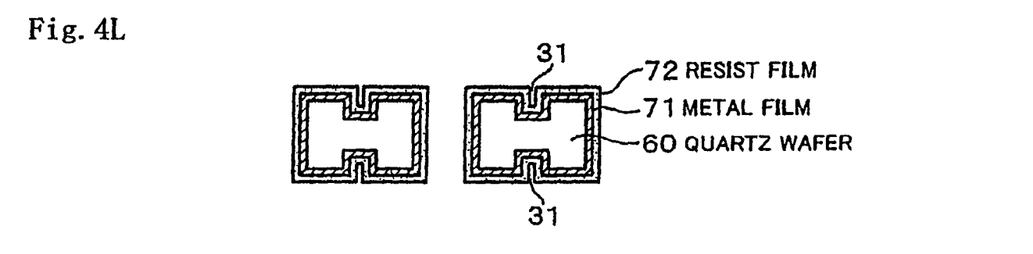
Figure 4M:
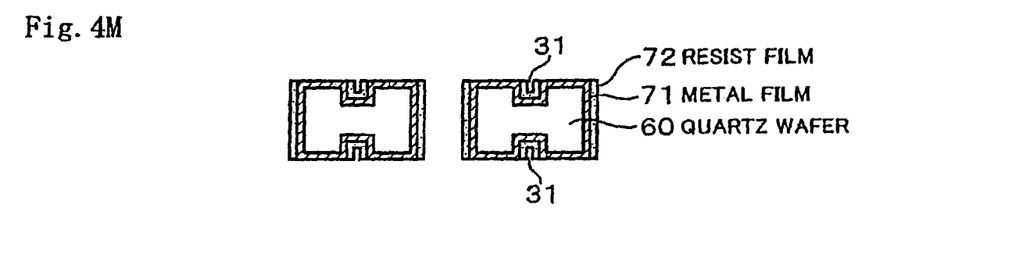
Figure 4N:
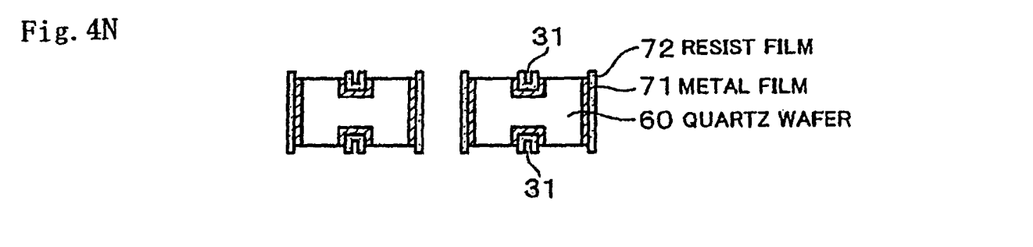
Figure 4O:
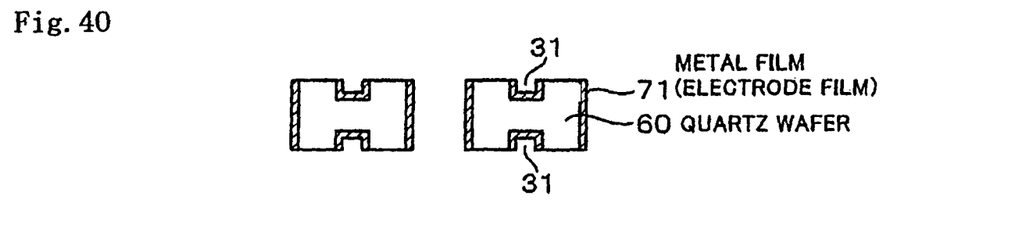

Then, photoresist is applied to such a metal film 71 by a spray method (FIG. 4L). A resist film 72 excepting that corresponds to an electrode pattern is peeled off by photolithography (FIG. 4M). Thereafter, the metal film 71 at the portion where the resist film 72 has been peeled off is etched to form the electrode pattern (FIG. 4N). Then, all of the resist film 72 remaining on the original 6 is peeled out (FIG. 4O). Then, the quartz resonator shown in FIG. 1 is to be cut out from the original 6, in which the electrode pattern is formed.

In the above-described embodiment, etching for forming the outside shape of the quartz piece 65 and etching for forming the grooves 31 and 32 are conducted simultaneously, and after the formation of the grooves 31 and 32, the shape formation of the quartz piece 65 is started again from the same depth as the grooves 31 and 32 in a state of covering the grooves 31 and 32 with the metal film 63. Then after the shape formation, the frequency matching is conducted by etching the side surface of the quartz piece 65 in succession. Accordingly, it is possible to perform the frequency matching by processing only the side surface of the quartz piece 65. Accordingly, compared with the usual practice of conducting the frequency matching by processing the side surface of the quartz piece and processing the grooves formed in the vibrating arms at the same time, the frequency matching can be achieved at a low etching rate. Therefore, it is possible to perform the frequency matching without undue difficulty and with high accuracy. This makes it possible to get the piezoelectric oscillating piece having easily adjustable range of frequency with high reliability when conducting the fine frequency adjustment after forming the electrode pattern later.

Furthermore, according to the above-described embodiment, the outside shape of the quartz piece 65 and the grooves 31 and 32 are formed simultaneously, and in the middle of the process, the grooves 31 and 32 are covered with the metal film 63, while the outside shape etching of the quartz piece 65 is continued. Therefore, the manufacturing process of the quartz resonator is simplified with no complication and reduction of the manufacturing process can be realized.

In the above-described embodiment, the metal film 63 is formed in the grooves 31 and 32 of the vibrating arms 2a and 2b as shown in FIG. 3I through the manufacturing process shown in FIG. 3F to FIG. 3H. However, it is also possible that after the process shown in FIG. 2E, a mask having a plurality of holes of the same size as the grooves 31 and 32 formed in the quartz wafer 60 is used, and the mask is positioned on the upper side of the quartz wafer 60 in a way that the holes of the mask and the grooves 31 and 32 formed in the quartz wafer 60 are respectively laid on top of one another so that the metal film 63 is directly formed only on the grooves 31 and 32 of the vibrating arms 2a and 2b via the mask. This mask is provided with a groove-shaped hole by chemical etching or press processing on a thin plate made of stainless steel or the like.

Figure 6A:
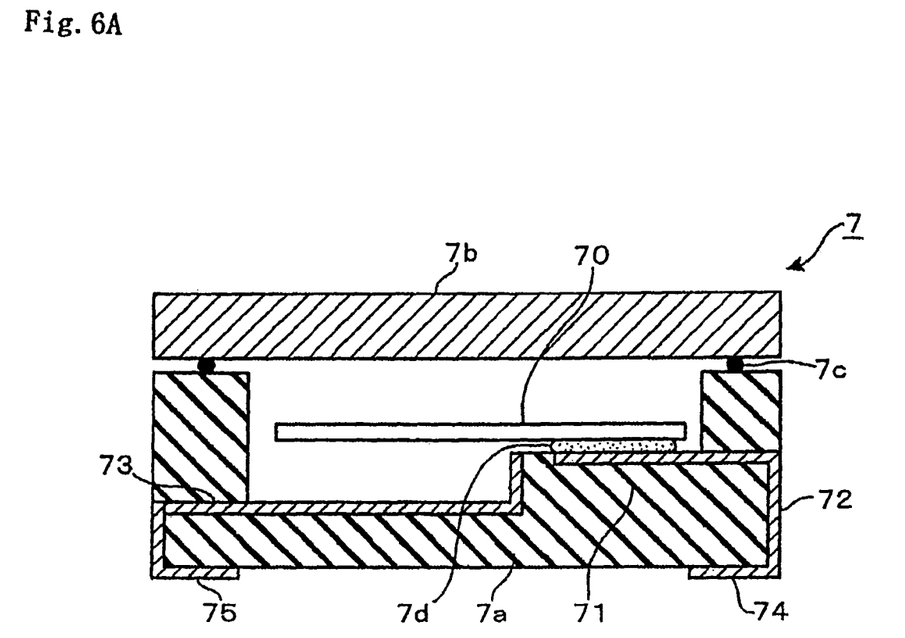
FIGS. 6A and 6B are a schematic vertical cross sectional view and a back view showing an example of quartz resonator packages which house the tuning fork type quartz resonator relating to an embodiment of the present invention.
Figure 6B:
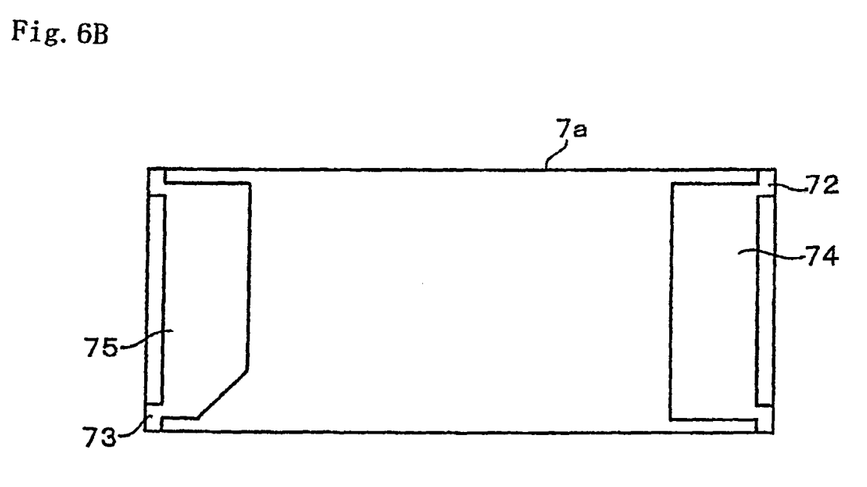

In addition, the above-described quartz resonator is housed in a package 7 made of Surface Mounted Device (SMD) structure ceramics as shown in, for instance, FIGS. 6A and 6B. The package 7 is composed of a case 7a made of, for instance, ceramics, of which the upper surface has an aperture, and a lid 7b made of, for instance, metal. The case 7a and the lid 7b are seam welded via a sealant 7c made from, for instance, a welding material, and the inside thereof is in a vacuum state. In the inside of the above-described package 7, the base 1 of the quartz resonator 70 is fixed to a pedestal 71 via a conductive adhesive 7d. The posture of the quartz resonator 70 in the above-described package 7 is horizontal as such that the vibrating arms 2a and 2b are extending into a space on the inside of the package 7. On the surface of the pedestal 71, conductive paths 72 and 73 (73 is a conductive path arranged at right angle to the drawing) are placed, and the derivation electrodes 42 and 52 formed on the base 1 are connected to the conductive paths 72 and 73 via the conductive adhesive 7d. The above-described conductive paths 72 and 73 are connected respectively to electrodes 74 and 75 arranged in a manner to oppose to the longitudinal direction of the outside bottom surface of the case 7a. As a result, the above-described quartz resonator 70 is forced to oscillate when a voltage is applied is to the derivation electrodes 42 and 52 of the base 1 via the electrodes 74, 75, the conductive paths 72, 73, and the conductive adhesive 7d. Thus, a package type quartz resonator is structured. The quartz resonator is installed on a wiring substrate (not shown) on which the circuit part of an oscillation circuit is installed, and thereby electric parts are structured.

What is claimed is:

1. A method for manufacturing a plurality of piezoelectric resonators, each one piezoelectric resonator including a base, a plurality of vibrating arms extending from the base, and grooves formed in the respective vibrating arms, the method comprising:

forming a first metal film on a surface of a piezoelectric substrate;

forming a pattern of openings in the first metal film, said pattern forming including forming a first resist mask having apertures at portions where the grooves of the vibrating arms are to be formed, and removing portions of the metal film by etching;

forming the grooves of the vibrating arms in the substrate, after said pattern forming, by bringing said substrate into contact with a first etching solution, wherein substrate material is removed to shape an outer surface of the substrate to the same depth as said grooves;

after said groove forming, filling in with a second metal film openings in the first metal film that correspond to the grooves of the vibrating arm;

shaping the substrate into a first plurality of piezoelectric resonators by bringing said substrate into contact with a second etching solution;

after said shaping, conducting rough frequency adjustment by etching side surfaces of the substrate in increments, wherein between increments a piezoelectric resonator for evaluation from among the first plurality of piezoelectric resonators is cut from the substrate, said rough frequency adjustment further comprising forming an electrode on the piezoelectric resonator for evaluation and measuring oscillation frequency of the piezoelectric resonator for evaluation, said rough frequency adjustment continuing until a measured oscillation frequency is within a predetermined frequency range, wherein a remainder of the first plurality of piezoelectric resonators on the substrate, after said rough frequency adjustment, comprise a second plurality of piezoelectric resonator; and after said rough frequency adjustment, forming electrode patterns for each one of the second plurality of piezoelectric resonators.

* * * * *